(12) United States Patent
Ishizuka et al.

(10) Patent No.: US 9,735,045 B2
(45) Date of Patent: Aug. 15, 2017

(54) METHOD OF FABRICATING SOI WAFER BY ION IMPLANTATION

(71) Applicant: SHIN-ETSU HANDOTAI CO., LTD., Tokyo (JP)

(72) Inventors: Toru Ishizuka, Takasaki (JP); Norihiro Kobayashi, Takasaki (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 0 days.

(21) Appl. No.: 14/787,647

(22) PCT Filed: Mar. 25, 2014

(86) PCT No.: PCT/JP2014/001680
§ 371 (c)(1),
(2) Date: Oct. 28, 2015

(87) PCT Pub. No.: WO2014/192207
PCT Pub. Date: Dec. 4, 2014

(65) Prior Publication Data
US 2016/0079114 A1    Mar. 17, 2016

(30) Foreign Application Priority Data

May 29, 2013    (JP) .................................. 2013-113307

(51) Int. Cl.
*H01L 21/30*    (2006.01)
*H01L 21/762*    (2006.01)
(Continued)

(52) U.S. Cl.
CPC .. *H01L 21/76254* (2013.01); *H01L 21/02329* (2013.01); *H01L 21/187* (2013.01);
(Continued)

(58) Field of Classification Search
CPC . H01L 27/1203; H01L 21/324; H01L 21/265; H01L 21/6835; H01L 21/02255;
(Continued)

(56) References Cited

U.S. PATENT DOCUMENTS 5,374,564 A    12/1994  Bruel
5,530,265 A     6/1996  Takemura
(Continued)

FOREIGN PATENT DOCUMENTS

EP        2 175 477 A1    4/2010
JP       2012-222294 A   11/2012
WO       03-009386 A1     1/2003

OTHER PUBLICATIONS

Jan. 21, 2016 Search Report issued in Taiwanese Patent Application No. 103118642.
(Continued)

*Primary Examiner* — Alonzo Chambliss
(74) *Attorney, Agent, or Firm* — Oliff PLC

(57) ABSTRACT

The present invention provides a method of manufacturing a bonded wafer, including performing RTA under an atmosphere containing hydrogen on a bonded wafer after separating the bond wafer constituting the bonded wafer, and subsequently performing a sacrificial oxidation process to reduce the thickness of the thin film, wherein the RTA is performed under conditions of a retention start temperature of more than 1150° C. and a retention end temperature of 1150° C. or less. The invention can inhibit the BMD density from increasing and sufficiently flatten the surface of a thin film when the thin film of the bonded wafer is flattened and thinned by the combination of the RTA and sacrificial oxidation processes.

7 Claims, 3 Drawing Sheets

(51) Int. Cl.
*H01L 27/12* (2006.01)
*H01L 21/265* (2006.01)
*H01L 21/324* (2006.01)
*H01L 21/02* (2006.01)
*H01L 21/683* (2006.01)
*H01L 21/18* (2006.01)

(52) U.S. Cl.
CPC .......... *H01L 21/265* (2013.01); *H01L 21/324* (2013.01); *H01L 21/3247* (2013.01); *H01L 21/6835* (2013.01); *H01L 27/1203* (2013.01)

(58) Field of Classification Search
CPC ........... H01L 21/3247; H01L 21/76254; H01L 21/187; H01L 21/02329
See application file for complete search history.

(56) References Cited

U.S. PATENT DOCUMENTS

| | | | |
|---|---|---|---|
| 6,362,076 B1 | 3/2002 | Inazuki et al. | |
| 6,372,609 B1 | 4/2002 | Aga et al. | |
| 2003/0181001 A1 | 9/2003 | Aga et al. | |
| 2005/0026426 A1 | 2/2005 | Maleville et al. | |
| 2006/0223283 A1 | 10/2006 | Maleville et al. | |
| 2008/0188060 A1 | 8/2008 | Neyret | |
| 2009/0261299 A1 | 10/2009 | Watanabe et al. | |
| 2010/0052092 A1 | 3/2010 | Capello et al. | |
| 2010/0120223 A1 | 5/2010 | Kobayashi et al. | |
| 2010/0291752 A1 | 11/2010 | Okuno | |
| 2011/0014776 A1 | 1/2011 | Akiyama et al. | |
| 2011/0117727 A1 | 5/2011 | Oka et al. | |
| 2012/0021613 A1 | 1/2012 | Schwarzenbach et al. | |
| 2014/0030870 A1* | 1/2014 | Akiyama | H01L 21/265 438/458 |

OTHER PUBLICATIONS

Jun. 7, 2016 Office Action issued in Japanese Patent Application No. 2013-113307.
Jun. 3, 2014 Search Report issued in International Patent Application No. PCT/JP2014/001680.
Jan. 30, 2017 Search Report issued in European Patent Application No. 14804151.0.
Feb. 16, 2017 Office Action issued in Chinese Application No. 201480028918.5.

* cited by examiner

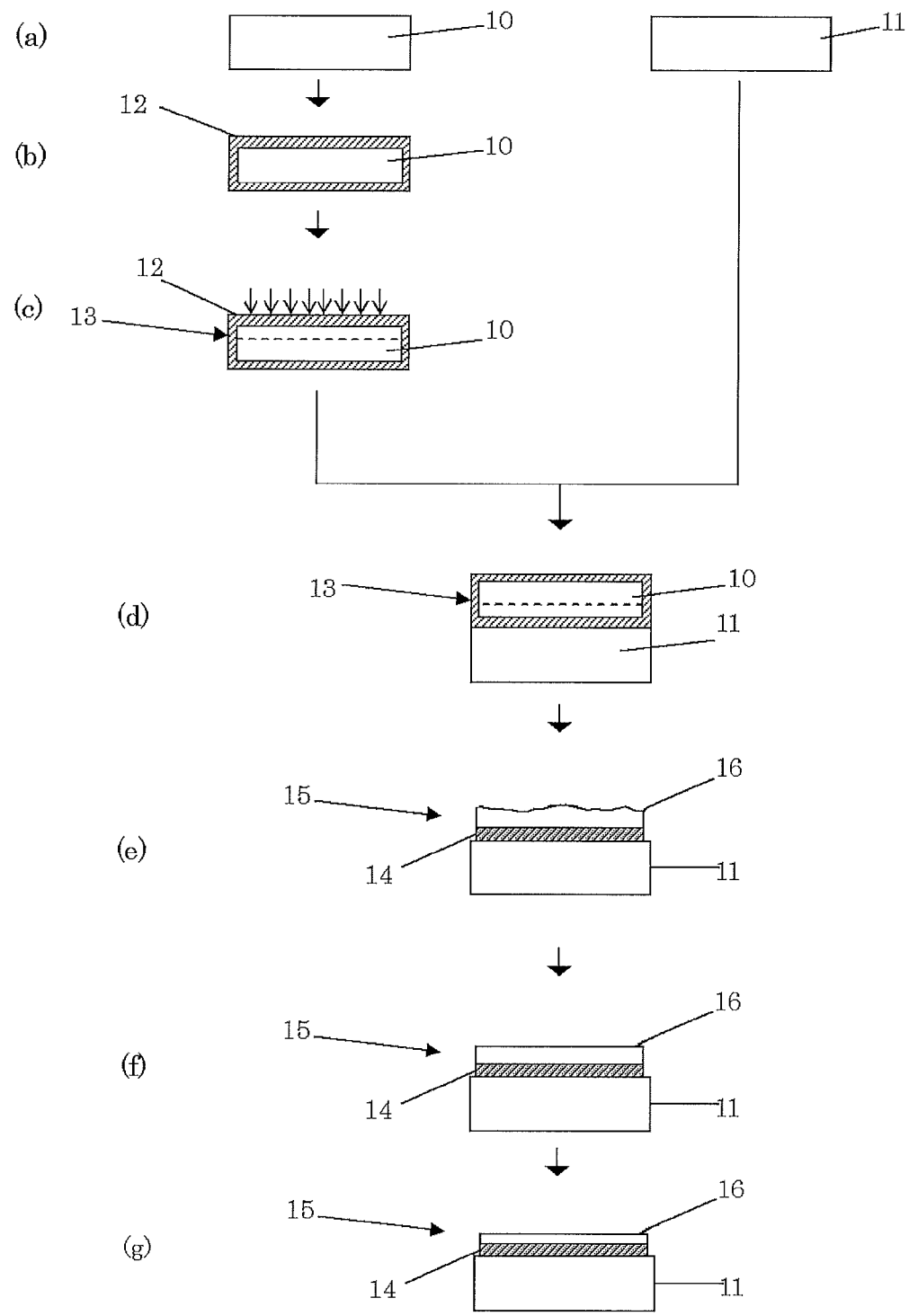

METHOD OF FABRICATING SOI WAFER BY ION IMPLANTATION

TECHNICAL FIELD

The present invention relates to a method of manufacturing a bonded wafer by an ion implantation separation method.

BACKGROUND ART

A method of separating ions-implanted wafers after bonding to manufacture SOI wafers, i.e., an ion implantation separation method (a technique also referred to as the Smart Cut method (registered trademark)), has attracted attention as a method of manufacturing silicon on insulator (SOI) wafers, particularly a method of manufacturing thin-SOI wafers that enable improvement in performance of advanced integrated circuits.

This ion implantation separation method is a technique to form an SOI wafer (See Patent Literature 1) in the following manner: an oxide film (an insulator film) is formed on at least one of two silicon wafers; gas ions such as hydrogen ions or rare gas ions are implanted from a front surface of one of the silicon wafers (a bond wafer) to form a micro bubble layer (an enclosed layer) in the interior of the wafer; the surface from which the ions are implanted is then brought into close contact with the other silicon wafer (a base wafer) through the oxide film; a heat treatment (a delamination heat treatment) is then performed to cleave one of the wafers (the bond wafer) along the micro bubble layer so that the bond wafer is separated into a thin film; and another heat treatment (a bonding heat treatment) is then performed to strengthen a bond between the wafers. At this point, the cleavage plane (the separation surface) is a surface of an SOI layer and an SOI wafer having a thin SOI with high uniformity is relatively readily obtained. The ion implantation separation method can manufacture a bonded wafer by bonding the bond wafer and the base wafer directly without the insulator film.

The SOI wafer after the separation, however, has a damage layer on its surface due to the ion implantation. This surface is rougher than a surface of a normal mirror-polished silicon wafer. The ion implantation separation method accordingly needs to eliminate such a damage layer and surface roughness.

Conventionally, mirror polishing with extremely small polishing stock removal (a stock removal of about 100 nm), referred to as touch polishing, is performed to remove the damaged layer and so on in the final step after the bonding heat treatment. Even though the implantation of ions such as hydrogen ions and the separation can achieve the uniformity of the thickness of the SOI layer to a certain extent, a polishing process including such a mechanical factor performed on the SOI layer degrades this uniformity because of nonuniform polishing stock removal.

To solve this problem, a flattening process including a high-temperature heat treatment is recently performed to improve the surface roughness, instead of the touch polishing.

Patent Literature 2, for example, proposes performing rapid thermal annealing (RTA) of a heat treatment under a reducing atmosphere containing hydrogen without polishing a surface of an SOI layer after the delamination heat treatment or the bonding heat treatment. Patent Literature 3 in claim 2 etc., proposes forming an oxide film on an SOI layer by a heat treatment under an oxidizing atmosphere after the delamination heat treatment or the bonding heat treatment, then removing the oxide film (a sacrificial oxidation process), and then performing a heat treatment (the RTA process) under a reducing atmosphere.

In Patent Literature 4, oxidation induced stacking faults (OSFs), which are easy to occur when the separation surface is directly oxidized, are avoided by performing a sacrificial oxidation process after a flattening heat treatment is performed under an atmosphere of inert gas, hydrogen gas, or mixed gas thereof. In this way, the separation surface can be flattened and the OSFs can be avoided.

Patent Literature 5 discloses a bonding heat treatment performed by an oxidation heat treatment at a temperature of less than 950° C. and a subsequent heat treatment at a temperature of 1000° C. or more under an inert gas atmosphere containing oxygen of not more than 5%, in order to reliably prevent OSFs from occurring on the separation surface when the bonding heat treatment is performed under an oxidizing atmosphere to enhance the bonding strength of a bonded wafer after the separation.

Patent Literature 6 discloses a method of manufacturing a bonded wafer, including a first RTA process performed under an atmosphere containing hydrogen on a bonded wafer after the separation of a bond wafer, a sacrificial oxidation process performed to reduce the thickness of a thin film, and a subsequent second RTA process performed at a higher temperature than that in the first RTA process under an atmosphere containing hydrogen, for the purpose of providing a method of manufacturing a bonded wafer that can inhibit an increase in BMD density and flatten the surface of the thin film sufficiently when the thin film of the bonded wafer is flattened and thinned by the combination of the RTA and sacrificial oxidation processes.

CITATION LIST

Patent Literature

Patent Literature 1: Japanese Unexamined Patent publication (Kokai) No. H05-211128
Patent Literature 2: Japanese Unexamined Patent publication (Kokai) No. H11-307472
Patent Literature 3: Japanese Unexamined Patent publication (Kokai) No. 2000-124092
Patent Literature 4: International Publication No. WO2003/009386
Patent Literature 5: Japanese Unexamined Patent publication (Kokai) No. 2010-98167
Patent Literature 6: Japanese Unexamined Patent publication (Kokai) No. 2012-222294

SUMMARY OF INVENTION

Technical Problem

According to the above literatures, RTA is performed at a high temperature under a reducing atmosphere containing hydrogen and the sacrificial oxidation process is performed before or after the RTA, in order to remove the damage layer due to ion implantation and flatten the surface (which is the separation surface: the surface of an SOI layer in the case of an SOI wafer) of the thin film right after the separation, when a bonded wafer such as an SOI wafer is manufactured by the ion implantation separation method.

It has been revealed that when the thin film is flattened and thinned (i.e., removal of the damage and adjustment of the thickness) by the combination of the RTA and sacrificial oxidation processes, the density of oxide precipitates, bulk micro defects (BMDs), in the base wafer may be increased. In general, since BMDs are melted by the RTA, the BMD density decreases. However, it has been revealed that even though the RTA briefly reduces large BMDs, new small BMD nuclei are created at a high density; these nuclei grow in size into BMDs by the subsequent sacrificial oxidation process; this rather increases the BMD density. It has been also revealed that as the RTA is performed at a higher temperature, the BMD density further increases by the subsequent sacrificial oxidation process.

It is known that a high BMD density may cause large deformations of a bonded wafer (such as an SOI wafer) when the wafer is subjected to a heat treatment in a device process, thereby arising the problem in that a failure of misalignment of patterns occurs in photolithography. It is understood that the inhibition of an increase in BMD density is an important factor in quality of a bonded wafer for use in fabrication of an advanced integrated circuit with high performance, which needs particularly fine photolithography.

The present invention was accomplished in view of the above-described problems. It is an object of the present invention to provide a method of manufacturing a bonded wafer that can inhibit the BMD density from increasing and sufficiently flatten the surface of the thin film when the thin film of the bonded wafer is flattened and thinned by the combination of the RTA and sacrificial oxidation processes.

Solution to Problem

To achieve this object, the present invention provides a method of manufacturing a bonded wafer, comprising: implanting at least one gas ion selected from a hydrogen ion and a rare gas ion into a bond wafer from a surface of the bond wafer to form a layer of the implanted ion; bonding the surface from which the ion is implanted into the bond wafer and a surface of a base wafer directly or through an insulator film; subsequently separating the bond wafer along the layer of the implanted ion to form a bonded wafer having a thin film on the base wafer; performing rapid thermal annealing (RTA) under an atmosphere containing hydrogen on the bonded wafer after separating the bond wafer; and subsequently performing a sacrificial oxidation process to reduce a thickness of the thin film; wherein the RTA is performed under conditions of a retention start temperature of more than 1150° C. and a retention end temperature of 1150° C. or less.

These ranges of retention start temperature and retention end temperature enable the surface of the thin film to be sufficiently flattened. This range of retention end temperature also enables sufficient inhibition of the formation of new small BMD nuclei in the bonded wafer. The BMD density can consequently be inhibited from increasing even when the sacrificial oxidation process is performed to reduce the thickness of the thin film after the RTA.

The temperature fall preferably occurs without a temperature rise during a retention period of transition between the retention start temperature and the retention end temperature.

Such adjustment of the temperature during the retention period enables the temperature to be more reliably 1150° C. or less in the final phase of the RTA even when the initial phase of the RTA starts at a high temperature that allows for sufficient flattening of the surface of the thin film, thereby also reducing the processing time.

The retention start temperature preferably ranges from 1175° C. to 1250° C., and the retention end temperature preferably ranges from 1100° C. to 1150° C.

These ranges of retention start temperature and retention end temperature enable the surface of the thin film to be more electively flattened. In addition, this range of retention end temperature enables sufficient inhibition of the formation of new small BMD nuclei.

Advantageous Effects of Invention

According to the inventive method of manufacturing a bonded wafer, the RTA is performed such that the retention temperature is higher at the beginning and lower at the end, and the sacrificial oxidation process is subsequently performed. The invention can thereby produce a bonded wafer having a low BMD density and smoothed surface roughness. This bonded wafer having a low BMD density is prevented from severely deforming even when being subjected to a heat treatment in a device process, and hardly causes a failure of misalignment of patterns in photolithography.

BRIEF DESCRIPTION OF DRAWINGS

FIG. 7 is a flowchart showing an exemplary embodiment of the inventive method of manufacturing a bonded wafer.

DESCRIPTION OF EMBODIMENTS

Figure 1:
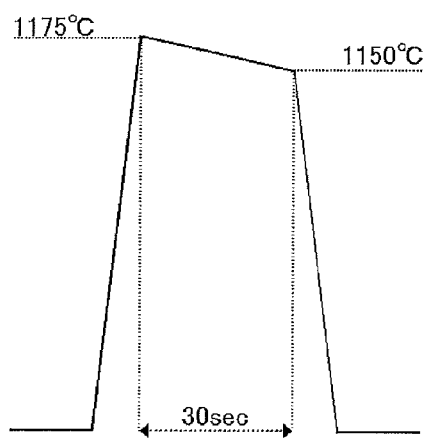
FIG. 1 is a graph showing a temperature profile of RTA in manufacture of a bonded wafer in example 1.

An embodiment of the inventive method of manufacturing a bonded wafer will hereinafter be described with reference to the drawings, but the present invention is not limited to this embodiment.

The following description mainly includes an embodiment of manufacture of an SOI wafer. The inventive method of manufacturing a bonded wafer, however, is applicable to manufacture of a direct binding wafer obtained by directly bonding two wafers without forming an insulator film.

FIG. 7 is a flowchart of a method of manufacturing a bonded wafer according to the present invention.

As shown in FIG. 7 at the step (a), first, a bond wafer 10 and a base wafer 11, which is a support wafer, are prepared. The bond wafer 10 and the base wafer 11 can be mirror-polished silicon single crystal wafers.

In the step (a), the base wafer 11, which is used as a support wafer for the bonded wafer, may be selected from substrates having a comparatively high oxygen concentration so as to exhibit the ability to avoid slip dislocations in subsequent heat treatments.

Alternatively, a substrate having a high concentration of oxygen, nitrogen, or boron may be selected as the base wafer 11 to reduce the effect of impurities from a device active layer due to gettering. Circumstances in which the BMD density of the bonded wafer is potentially easy to increase may be thus selected depending on the type of the substrate used in the bonded wafer. The preset invention, in contrast, can effectively inhibit the increase in BMD density even when such a substrate is used.

As shown in FIG. 7 at the step (b), an oxide film 12, which will be a buried oxide film, is then formed on the bond wafer 10, for example, by thermal oxidation or CVD oxidation. Any known insulator film such as a nitride film or an oxynitriding film may be formed instead of the oxide film. This oxide film (insulator film) 12 may be formed only in the base wafer 11 or in both the wafers. If the direct bonding wafer is produced, then the formation of the oxide film is not necessarily needed.

As shown in FIG. 7 at the step (c), at least one type of gas ions selected from a group including hydrogen ions and rare gas ions are then implanted into the bond wafer 10 from the surface of the bond wafer 10 to form a layer 13 of the implanted ions. For example, at least one type of gas ions selected from a group including hydrogen ions and rare gas ions are implanted from the surface of the oxide film 12 formed on the surface of the bond wafer 10 to form the layer 13 of the implanted ions in the interior of the bond wafer 10 with an ion implantation apparatus. In this step (c), an accelerating voltage of the ion implantation can be selected such that a thin film having a target thickness can be obtained.

As shown in FIG. 7 at the step (d), the surface from which the ions are implanted into the bond wafer 10 and a surface of the base wafer 11 are then bonded directly or through the insulator film 12. It is to be noted that a pre-cleaning to remove particles or organic substances attached on the wafer surface may be performed on both the wafers before the bonding process; a plasma treatment to enhance the bonding strength at a binding interface may be performed on the wafer surface.

As shown in FIG. 7 at the step (e), the bond wafer 10 is then separated along the layer 13 of the implanted ions. A bonded wafer 15 having a thin film 16 on the base wafer 11 is consequently formed. This step (e) performs heat treatment including a heat treatment to retain the bonded wafer, for example, at temperatures from 350° C. to 500° C. under an inert gas atmosphere and thereby to form a micro bubble layer at the layer 13 of the implanted ions, and separates the bond wafer 10 along the implanted-ions layer (the micro bubble layer) 13 serving as a boundary, thereby obtaining the bonded wafer 15 having the thin film 16 and a buried oxide film (a buried insulator film) 14 on the base wafer 11.

As shown in FIG. 7 at the step (f) after the steps (a) to (e), a rapid thermal annealing (RTA) process is performed under an atmosphere containing hydrogen to flatten the separation surface of the thin film 16 on the bonded wafer 15 after separating the bond wafer 10. The retention start temperature of this RTA is more than 1150° C. The retention end temperature of this RTA is 1150° C. or less. The RTA may use a single-wafer-processing type of heat treatment furnace with a ramp for heating, or an epitaxial growth furnace that allows for processes up to epitaxial growth.

When the retention start temperature and retention end temperature are within these ranges, the average temperature can be kept high during the high temperature retention, and the surface of the thin film can be sufficiently flattened. Besides, when the retention end temperature is reduced to that temperature, the bonded wafer can be sufficiently inhibited from forming new BMD nuclei with small size.

It is usually understood that RTA melts and reduces BMDs temporarily but forms high density of small BMD nuclei. The RTA in the inventive method of manufacturing a bonded wafer, in contrast, enables sufficient inhibition of new formation of small BMD nuclei, as described previously.

In the invention, the RTA includes a period at which the temperature is rapidly increased (10° C./second or more, normally 50° C./second or less), a period at which a high temperature is retained, and a period at which the temperature is rapidly decreased (10° C./second or more, normally 50° C./second or less); the retention start temperature and retention end temperature represent the initial temperature and the last temperature in this high-temperature retention between this rapid temperature increase and this rapid temperature decrease, respectively.

The retention start temperature in the invention is the temperature at which the rapid temperature increase is finished. In other words, the retention start temperature in the invention is the temperature at which the increase rate of the temperature is rapidly decreased when the temperature is rapidly increased up to the retention temperature in the RTA. In particular, the temperature becomes constant or decreases after it reaches the retention start temperature, which is a high temperature.

The retention end temperature in the invention is the temperature at which the rapid temperature decrease is started and the decrease rate of the temperature is rapidly increased. When the temperature becomes 1150° C. or less, for example, this decrease rate of the temperature is rapidly increases; the retention end temperature can be determined to be a temperature at which the decrease rate becomes, for example, 10° C./second or more.

Moreover, the RTA is preferably performed such that a temperature fall occurs without a temperature rise during the retention period of transition between the retention start temperature and the retention end temperature. Such adjustment of the temperature during the retention period enables the temperature to be more reliably 1150° C. or less in the final phase of the RTA even when the initial phase of the RTA starts at a high temperature that allows for sufficient flattening of the surface of the thin film. In addition, the retention period at a high temperature can be reduced. The temperature fall in the high-temperature retention period is not particularly limited. For example, patterns shown in FIG. 1 to FIG. 4 are acceptable. The temperature may fall at a constant rate or after the retention start temperature is maintained for a prescribed time. The rate of the temperature fall may be, for example, 0.1 to 5° C./second.

Moreover, in the RTA, the retention start temperature preferably ranges from 1175° C. to 1250° C., and the retention end temperature preferably ranges from 1100° C. to 1150° C. The retention start temperature is preferably as a higher temperature as possible, such as 1200° C. or more, to further improve the surface roughness by the RTA.

These ranges of retention start temperature and retention end temperature enable the average temperature in the high-temperature retention to be increased, thereby more effectively flatting the surface of the thin film. In addition, this range of retention end temperature also enables new formation of small BMD nuclei to be sufficiently inhibited.

As shown in FIG. 7 at the step (g) after the RTA in the step (f), a sacrificial oxidation process is performed to reduce the thickness of the thin film 16. For example, the surface of the thin film 16 is thermally oxidized to form an oxide film by an oxidation heat treatment with a batch type of vertical furnace and this oxide film is removed with a solution containing HF to reduce the thickness of the thin film 16.

When the sacrificial oxidation process is performed, the thickness of the oxide film is selected depending on the target thickness. In order to reliably prevent OSFs, which are easy to occur on the separation surface, the bonding heat treatment to enhance the bonding strength between the bond wafer 10 and the base wafer 11 may be performed by an oxidation heat treatment at temperatures less than 950° C. and a subsequent heat treatment at 1000° C. or more under an inert gas atmosphere containing oxygen of not more than 5%; then a grown oxide film is removed.

The RTA in the step (f) and the sacrificial oxidation process in the step (g) may be performed multiple times. Under conventional conditions, RTA removes BMDs but creates small BMD nuclei and sacrificial oxidation grows the size of the BMDs every time the RTA and the sacrificial oxidation process are repeated. The RTA according to the invention, however, can sufficiently inhibit new formation of small BMD nuclei, thereby enabling the inhibition of an increase in BMD density due to the sacrificial oxidation process, as described previously.

When the RTA is performed under an atmosphere containing hydrogen on the bonded wafer after the bond wafer is separated, the invention can perform this RTA by a heat treatment having a temperature retention profile including the initial processing phase of flattening the thin film surface by increasing the temperature to a high level permitting sufficient flattening of this surface and the final processing phase of decreasing the temperature to a level equal to or lower than the maximum of a temperature range in which new small BMD nuclei are hardly formed. Since there are nearly no newly formed BMD nuclei in the RTA, the increase in BMD density can be inhibited even when the thickness of the thin film 16 is reduced by the sacrificial oxidation process after the RTA.

EXAMPLES

The present invention will be more specifically described below with reference to examples and comparative examples, but the invention is not limited to these examples.

Example 1

A silicon single crystal wafer (having a diameter of 300 mm and a crystal orientation of <100>) with no crystal originated particle (COP) was prepared as a bond wafer. After a 190-nm oxide film was grown on this bond wafer, $5\times10^{16}$ atoms/cm$^2$ of H$^+$ ions were implanted at an acceleration energy of 50 keV with an ion implantation apparatus to form a layer of the implanted ions.

A silicon single crystal wafer (having no oxide film, a diameter of 300 mm, and a crystal orientation of <100>) with an oxygen concentration of 22.4 ppma (ASTM'79) was prepared as a base wafer, and brought into close contact with the bonding surface of the implantation surface of the bond wafer. A heat treatment was then performed on these contacting wafers at temperatures ranging from a start temperature of 200° C. to a maximum temperature of 500° C. with a batch type of horizontal heat treatment furnace so that the bond wafer was separated along the layer of the implanted ions. An SOI layer was thereby formed on the base wafer.

With a single-wafer-processing type of RTA apparatus, a surface of this SOI layer was subjected to RTA under a mixed gas atmosphere of 50% hydrogen and 50% argon; this RTA included rapid temperature increase (30° C./second), rapid temperature decrease (30° C./second), and temperature retention period interposed therebetween; the temperature at the beginning of this retention was 1175° C.; the retention period was continued for 30 seconds while the temperature was monotonously decreased; and the temperature at the end of this retention was 1150° C. FIG. 1 shows the temperature profile of this heat treatment. An oxide film was then grown on the SOI surface (the surface of the SOI layer) by pyrogenic oxidation at 900° C. and a heat treatment at 1050° C. under an argon gas containing 1% oxygen in a batch type of vertical heat treatment furnace. The oxide film was then removed by HF cleaning to adjust the SOI thickness to 90 nm.

An infrared tomograph was used to measure the density of BMDs of this SOI wafer that were in a region up to 200 μm away from the back surface of the base wafer. The density was $1.1\times10^7$ count/cm$^3$. The surface roughness of this wafer was also measured at a region of 30-μm squares with an atomic force microscope (AFM). The value of root mean square (RMS) was 0.38 nm.

Example 2

Figure 2:
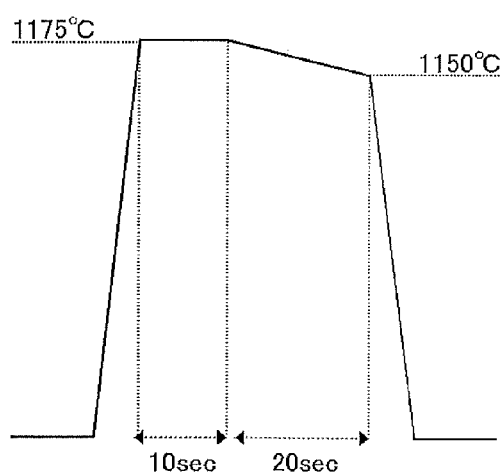
FIG. 2 is a graph showing a temperature profile of RTA in manufacture of a bonded wafer in example 2.

The bond wafer was separated along the layer of implanted ions under the same conditions as example 1 so that the SOI layer was formed on the base wafer. With a single-wafer-processing type of RTA apparatus, a surface of this SOI layer was subjected to RTA under a mixed gas atmosphere of 50% hydrogen and 50% argon; this RTA included rapid temperature increase (30° C./second), rapid temperature decrease (30° C./second), and temperature retention period interposed therebetween; the temperature at the beginning of this retention was 1175° C.; the retention period was first continued for 10 second at 1175° C. and then for 20 seconds while the temperature was monotonously decreased; and the temperature at the end of this retention was 1150° C. FIG. 2 shows the temperature profile of this heat treatment. An oxide film was then grown on the SOI surface by pyrogenic oxidation at 900° C. and a heat treatment at 1050° C. under an argon gas containing 1% oxygen in a batch type of vertical heat treatment furnace. The oxide film was then removed by HF cleaning to adjust the SOI thickness to 90 nm.

The infrared tomograph was used to measure the density of BMDs of this SOI wafer that were in a region up to 200 μm away from the back surface of the base wafer. The density was $1.2\times10^7$ count/cm$^3$. The surface roughness of this wafer was also measured at a region of 30-μm squares with AFM. The value of RMS was 0.36 nm.

Example 3

Figure 3:
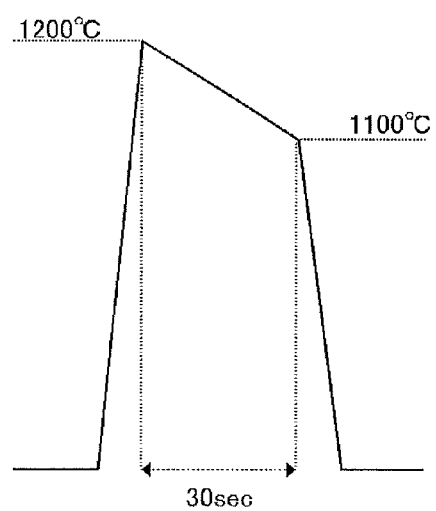
FIG. 3 is a graph showing a temperature profile of RTA in manufacture of a bonded wafer in example 3.

The bond wafer was separated along the layer of implanted ions under the same conditions as example 1 so that the SOI layer was formed on the base wafer. With a single-wafer-processing type of RTA apparatus, a surface of this SOI layer was subjected to RTA under a mixed gas atmosphere of 50% hydrogen and 50% argon; this RTA included rapid temperature increase (30° C./second), rapid temperature decrease (30° C./second), and temperature retention period interposed therebetween; the temperature at the beginning of this retention was 1200° C.; the retention period was continued for 30 seconds while the temperature was monotonously decreased; and the temperature at the end of this retention was 1100° C. FIG. 3 shows the temperature profile of this heat treatment. An oxide film was then grown on the SOI surface by pyrogenic oxidation at 900° C. and a heat treatment at 1050° C. under an argon gas containing 1% oxygen in a batch type of vertical heat treatment furnace. The oxide film was then removed by HF cleaning to adjust the SOI thickness to 90 nm.

The infrared tomograph was used to measure the density of BMDs of this SOI wafer that were in a region up to 200 μm away from the back surface of the base wafer. The density was $9.0\times10^6$ count/cm$^3$. The surface roughness of this wafer was also measured at a region of 30-μm squares with AFM. The value of RMS was 0.35 nm.

Example 4

Figure 4:
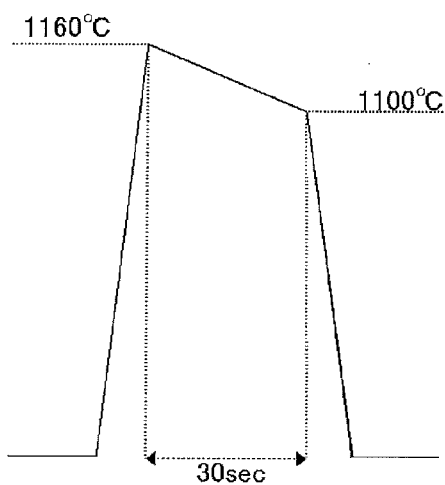
FIG. 4 is a graph showing a temperature profile of RTA in manufacture of a bonded wafer in example 4.

The bond wafer was separated along the layer of implanted ions under the same conditions as example 1 so that the SOI layer was formed on the base wafer. With a single-wafer-processing type of RTA apparatus, a surface of this SOI layer was subjected to RTA under a mixed gas atmosphere of 50% hydrogen and 50% argon; this RTA included rapid temperature increase (30° C./second), rapid temperature decrease (30° C./second), and temperature retention period interposed therebetween; the temperature at the beginning of this retention was 1160° C.; the retention period was continued for 30 seconds while the temperature was monotonously decreased; and the temperature at the end of this retention was 1100° C. FIG. 4 shows the temperature profile of this heat treatment. An oxide film was then grown on the SOI surface by pyrogenic oxidation at 900° C. and a heat treatment at 1050° C. under an argon gas containing 1% oxygen in a batch type of vertical heat treatment furnace. The oxide film was then removed by HF cleaning to adjust the SOI thickness to 90 nm.

The infrared tomograph was used to measure the density of BMDs of this SOI wafer that were in a region up to 200 μm away from the back surface of the base wafer. The density was $8.0\times10^6$ count/cm$^3$. The surface roughness of this wafer was also measured at a region of 30-μm squares with AFM. The value of RMS was 0.42 nm.

Comparative Example 1

Figure 5:
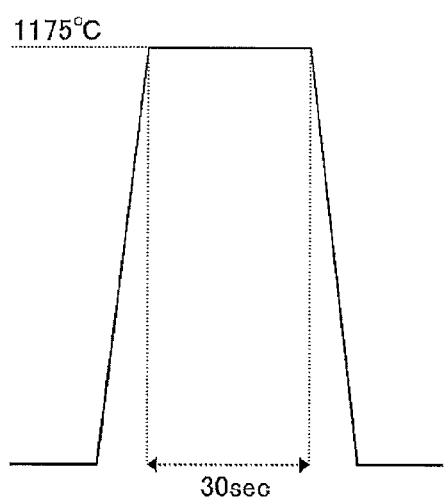
FIG. 5 is a graph showing a temperature profile of RTA in manufacture of a bonded wafer in comparative example 1.

The bond wafer was separated along the layer of implanted ions under the same conditions as example 1 so that the SOI layer was formed on the base wafer. With a single-wafer-processing type of RTA apparatus, a surface of this SOI layer was subjected to RTA under a mixed gas atmosphere of 50% hydrogen and 50% argon; this RTA included rapid temperature increase (30° C./second), rapid temperature decrease (30° C./second), and temperature retention period interposed therebetween; the temperature at the beginning of this retention was 1175° C.; the retention period was continued for 30 seconds while the same temperature was maintained; and the temperature at the end of this retention was 1175° C. FIG. 5 shows the temperature profile of this heat treatment. An oxide film was then grown on the SOI surface by pyrogenic oxidation at 900° C. and a heat treatment at 1050° C. under an argon gas containing 1% oxygen in a batch type of vertical heat treatment furnace. The oxide film was removed by HF cleaning to adjust the SOI thickness to 90 nm.

The infrared tomograph was used to measure the density of BMDs of this SOI wafer that were in a region up to 200 μm away from the back surface of the base wafer. The density was $3.0\times10^7$ count/cm$^3$. The surface roughness of this wafer was also measured at a region of 30-μm squares with AFM. The value of RMS was 0.37 nm.

Comparative Example 2

Figure 6:
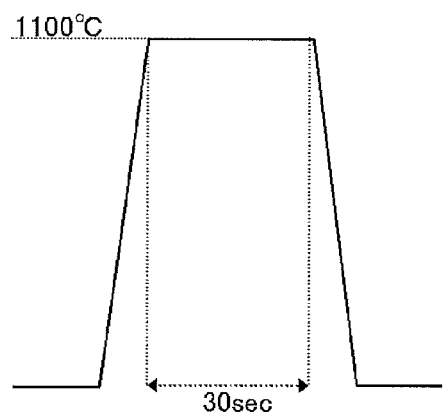
FIG. 6 is a graph showing a temperature profile of RTA in manufacture of a bonded wafer in comparative example 2.

The bond wafer was separated along the layer of implanted ions under the same conditions as example 1 so that the SOI layer was formed on the base wafer. With a single-wafer-processing type of RTA apparatus, a surface of this SOI layer was subjected to RTA under a mixed gas atmosphere of 50% hydrogen and 50% argon; this RTA included rapid temperature increase (30° C./second), rapid temperature decrease (30° C./second), and temperature retention period interposed therebetween; the temperature at the beginning of this retention was 1100° C.; the retention period was continued for 30 seconds while the same temperature was maintained; and the temperature at the end of this retention was 1100° C. FIG. 6 shows the temperature profile of this heat treatment. An oxide film was then grown on the SOI surface by pyrogenic oxidation at 900° C. and a heat treatment at 1050° C. under an argon gas containing 1% oxygen in a batch type of vertical heat treatment furnace. The oxide film was then removed by HF cleaning to adjust the SOI thickness to 90 nm.

The infrared tomograph was used to measure the density of BMDs of this SOI wafer that were in a region up to 200 μm away from the back surface of the base wafer. The density was $8.0\times10^6$ count/cm$^3$. The surface roughness of this wafer was also measured at a region of 30-μm squares with AFM. The value of RMS was 0.55 nm.

Table 1 summarizes the conditions and the results of examples 1 to 4 and comparative examples 1 and 2.

TABLE 1

| | Retention start temperature (° C.) | Retention end temperature (° C.) | BMD density (count/cm$^3$) | Surface roughness (RMS) (nm) |
|---|---|---|---|---|
| EXAMPLE 1 | 1175 | 1150 | $1.1\times10^7$ | 0.38 |
| EXAMPLE 2 | 1175 | 1150 | $1.2\times10^7$ | 0.36 |
| EXAMPLE 3 | 1200 | 1100 | $9.0\times10^6$ | 0.35 |
| EXAMPLE 4 | 1160 | 1100 | $8.0\times10^6$ | 0.42 |
| COMPARATIVE EXAMPLE 1 | 1176 | 1175 | $3.0\times10^7$ | 0.37 |
| COMPARATIVE EXAMPLE 2 | 1100 | 1100 | $8.0\times10^6$ | 0.55 |

As shown in Table 1, it can be understood that the surface roughness mainly depends on the average temperature during the high-temperature retention, and the BMD density mainly depends on the retention end temperature in the high-temperature retention. Comparing examples 1 and 2 with comparative example 1, there was no large difference in the surface roughness, but the BMD density in examples 1 and 2, which used a lower retention end temperature, was reduced to about one third of the BMD density in comparative example 1.

In example 3, the BMD density was further reduced by using a lower retention end temperature. In addition, although the retention end temperature was further decreased, the degradation of the surface roughness was prevented by using a higher retention start temperature to increase the average temperature during the high-temperature retention.

In example 4, the BMD density was reduced by using a lower retention end temperature of 1100° C. In addition, although the retention start temperature was comparatively low, because this temperature was higher than 1150° C., the degradation of the surface roughness was prevented compared with comparative example 2, which continued the retention at a constant temperature of 1100° C.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method of manufacturing a bonded wafer, comprising:

implanting at least one gas ion selected from a hydrogen ion and a rare gas ion into a bond wafer from a surface of the bond wafer to form a layer of the implanted ion;

bonding the surface from which the ion is implanted into the bond wafer and a surface of a base wafer directly or through an insulator film; subsequently separating the bond wafer along the layer of the implanted ion to form a bonded wafer having a thin film on the base wafer;

performing rapid thermal annealing (RTA) under an atmosphere containing hydrogen on the bonded wafer after separating the bond wafer; and subsequently performing a sacrificial oxidation process to reduce a thickness of the thin film, wherein the RTA is performed under conditions of a retention start temperature of more than 1150° C. and a retention end temperature of 1150° C. or less, and a temperature fall occurs without a temperature rise during a retention period of transition between the retention start temperature and the retention end temperature.

2. The method according to claim 1, wherein the retention start temperature ranges from 1175° C. to 1250° C., and the retention end temperature ranges from 1100° C. to 1150° C.

3. The method according to claim 1, wherein the rate of temperature fall is at a constant rate.

4. The method according to claim 1, wherein the retention start temperature is maintained for a period of time prior to falling to the retention end temperature.

5. The method according to claim 1, wherein the rate of temperature fall is 0.1 to 5° C./second.

6. The method according to claim 1, wherein the RTA includes a period, prior to reaching the retention start temperature, in which the temperature is increased at a rate of from 10° C./second to 50° C./second.

7. The method according to claim 1, wherein the RTA includes a period, after reaching the retention end temperature, in which the temperature is decreased at a rate of from 10° C./second to 50° C./second.

* * * * *